US009117773B2

(12) United States Patent
Shero et al.

(10) Patent No.: US 9,117,773 B2
(45) Date of Patent: Aug. 25, 2015

(54) HIGH CONCENTRATION WATER PULSES FOR ATOMIC LAYER DEPOSITION

(75) Inventors: Eric J. Shero, Phoenix, AZ (US); Mohith Verghese, Phoenix, AZ (US); Jan Willem Maes, Wilrijk (BE)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 12/547,911

(22) Filed: Aug. 26, 2009

(65) Prior Publication Data
US 2011/0053383 A1 Mar. 3, 2011

(51) Int. Cl.
| | |
|---|---|
| *H01L 21/31* | (2006.01) |
| *H01L 21/314* | (2006.01) |
| *C23C 16/40* | (2006.01) |
| *C23C 16/455* | (2006.01) |
| *H01L 21/02* | (2006.01) |
| *H01L 21/316* | (2006.01) |

(52) U.S. Cl.
CPC .......... *H01L 21/3141* (2013.01); *C23C 16/405* (2013.01); *C23C 16/45527* (2013.01); *H01L 21/0228* (2013.01); *H01L 21/02181* (2013.01); *H01L 21/31645* (2013.01)

(58) Field of Classification Search
USPC ................................................. 438/785, 787
See application file for complete search history.

(56) References Cited

U.S. PATENT DOCUMENTS

| | | | |
|---|---|---|---|
| 2,913,565 | A | 11/1959 | Von Kantzow |
| 3,719,025 | A | 3/1973 | Heinze et al. |
| 4,058,430 | A | 11/1977 | Suntola et al. |
| 4,059,094 | A | 11/1977 | Barrio de Mendoza |
| 4,389,973 | A | 6/1983 | Suntola et al. |
| 4,425,143 | A | 1/1984 | Nishizawa et al. |
| 4,548,138 | A | 10/1985 | Korenberg |
| 4,594,332 | A | 6/1986 | Hoelderich et al. |
| 4,747,367 | A | 5/1988 | Posa |
| 4,761,269 | A | 8/1988 | Conger et al. |
| 4,883,362 | A | 11/1989 | Gartner et al. |
| 4,947,790 | A | 8/1990 | Gartner et al. |
| 5,078,922 | A | 1/1992 | Collins et al. |
| 5,160,542 | A | 11/1992 | Mihira et al. |
| 5,451,258 | A | 9/1995 | Hillman et al. |

(Continued)

FOREIGN PATENT DOCUMENTS

| | | |
|---|---|---|
| CN | 1926668 A | 3/2007 |
| CN | 1934287 A | 3/2007 |

(Continued)

OTHER PUBLICATIONS

U.S. Appl. No. 10/629,029, filed Jul. 29, 2003; entitled, "Sublimation bed employing carrier gas guidance structures," to inventor Shero et al.
U.S. Appl. No. 10/846,206, filed May 14, 2004; entitled, "Method and apparatus for vaporizing and delivering reactant," to inventor Shero et al.
Leskela, ALD Precursor Chemistry: Evolution and Future Challenges, Journal do Physsique IV, 1999, vol. 9, pp. Pr8-837-Pr-852.
Niinisto et al., Synthesis of Oxide Thin Films and Overlayers by Atomic Layer Epitaxy for Advanced Applications, Materials Science and Engineering, 1996, vol. B41, pp. 23-29.
Pierson, Handbook of Chemical Vapor Deposition, 1992, pp. 87-88.
Raghu et al.. "Adsorption of Moisture and Organic Contaminants on Hafnium Oxide, Zirconium Oxide, and Silicon Oxide Gate Dielectrics" Journal of the Electro Chemical Society, 2002, pp. 1-9.

(Continued)

*Primary Examiner* — Alexander Ghyka
(74) *Attorney, Agent, or Firm* — Knobbe, Martens, Olson & Bear, LLP

(57) ABSTRACT

Methods are provided herein for forming thin films comprising oxygen by atomic layer deposition. The thin films comprising oxygen can be deposited by providing higher concentration water pulses, a higher partial pressure of water in the reaction space, and/or a higher flow rate of water to a substrate in a reaction space. Thin films comprising oxygen can be used, for example, as dielectric oxides in transistors, capacitors, integrated circuits, and other semiconductor applications.

20 Claims, 6 Drawing Sheets

(56) References Cited

U.S. PATENT DOCUMENTS

| | | | |
|---|---|---|---|
| 5,551,278 | A | 9/1996 | Rounbehler et al. |
| 5,553,395 | A | 9/1996 | Wen et al. |
| 5,561,735 | A | 10/1996 | Camm |
| 5,674,574 | A | 10/1997 | Atwell et al. |
| 5,698,037 | A | 12/1997 | Stauffer |
| 5,803,938 | A | 9/1998 | Yamaguchi et al. |
| 5,855,680 | A | 1/1999 | Soininen et al. |
| 5,904,771 | A | 5/1999 | Tasaki et al. |
| 6,033,493 | A | 3/2000 | Hertz et al. |
| 6,110,283 | A | 8/2000 | Yamamuka et al. |
| 6,132,492 | A | 10/2000 | Hultquist et al. |
| 6,270,839 | B1 | 8/2001 | Onoe et al. |
| 6,296,711 | B1 | 10/2001 | Loan et al. |
| 6,325,017 | B1 | 12/2001 | DeBoer et al. |
| 6,410,432 | B1 | 6/2002 | Hautala et al. |
| 6,571,821 | B2 | 6/2003 | Matte et al. |
| 6,718,126 | B2 | 4/2004 | Lei |
| 6,720,259 | B2 | 4/2004 | Londergan et al. |
| 7,202,185 | B1 | 4/2007 | Hausmann et al. |
| 2001/0000160 | A1 | 4/2001 | Schwaiger et al. |
| 2001/0024387 | A1* | 9/2001 | Raaijmakers et al. ......... 365/200 |
| 2001/0042523 | A1 | 11/2001 | Kesala |
| 2002/0115252 | A1 | 8/2002 | Haukka et al. |
| 2003/0053799 | A1 | 3/2003 | Lei |
| 2003/0054099 | A1 | 3/2003 | Jurgensen et al. |
| 2004/0016404 | A1 | 1/2004 | Gregg et al. |
| 2005/0271813 | A1 | 12/2005 | Kher |
| 2006/0252279 | A1* | 11/2006 | Vaartstra .................... 438/785 |
| 2007/0049053 | A1 | 3/2007 | Mahajani |
| 2008/0248263 | A1* | 10/2008 | Kobrin .................... 428/195.1 |
| 2008/0299288 | A1 | 12/2008 | Kobrin et al. |
| 2008/0305646 | A1 | 12/2008 | Yu |
| 2009/0195967 | A1* | 8/2009 | Srividya et al. ............... 361/524 |

FOREIGN PATENT DOCUMENTS

| | | |
|---|---|---|
| DE | 33 39 625 C2 | 1/1991 |
| EP | 0 382 987 | 8/1990 |
| GB | 2 151 662 | 7/1985 |
| JP | 63-014866 | 1/1988 |
| JP | 11-168092 | 6/1999 |
| JP | 2001-073144 | 3/2001 |
| TW | 486771 | 5/2002 |
| WO | WO 01/36702 | 5/2001 |

OTHER PUBLICATIONS

Random House Webster's Unabridged Dictionary, 2nd Edition, Random House, 2001, pp. 887-888.
Smith, Chemical Engineering Kinetics, 3rd Edition, McGraw-Hill Book Company, 1981, pp. 268-291.
Smith, Chemical Engineering Kinetics, 3rd Edition, McGraw-Hill Book Company, 1981, pp. 552-563.
Suntola, Atomic Layer Epitaxy, Thin Solid Films, 1992, vol. 216, pp. 84-89.
Webster's New World Dictionary, 2nd College Edition, The World Publishing Company, 1972, pp. 650.
U.S. Appl. No. 10/629,029, filed Jul. 29, 2003; Notice of Allowance mailed Jun. 20, 2006.
U.S. Appl. No. 10/629,029, filed Jul. 29, 2003; Office Action mailed Mar. 7, 2006.
U.S. Appl. No. 10/629,029, filed Jul. 29, 2003; Office Action mailed Jun. 22, 2005.
U.S. Appl. No. 10/629,029, filed Jul. 29, 2003; Office Action mailed Dec. 12, 2005.
U.S. Appl. No. 10/846,206, filed May 14, 2004; Office Action mailed Feb. 3, 2006.
U.S. Appl. No. 10/846,206, filed May 14, 2004; Office Action mailed Feb. 25, 2008.
U.S. Appl. No. 10/846,206, filed May 14, 2004; Office Action mailed Mar. 17, 2009.
U.S. Appl. No. 10/846,206, filed May 14, 2004; Office Action mailed Jun. 7, 2007.
U.S. Appl. No. 10/846,206, filed May 14, 2004; Office Action mailed Sep. 10, 2008.
International Search Report for PCT/US2010/045166 dated Mar. 31, 2011.
Office Action dated Oct. 11, 2014, received in Chinese Patent Application No. 2010800350289—in 6 pages (with English translation).
Office Action dated Feb. 8, 2014 in Chinese Application No. 2010800350289 with English Translation.
Office Action dated Apr. 13, 2015, received in Chinese Patent Application No. 2010800350289 with English translation.
Office Action dated Aug. 29, 2014 in Taiwanese Application No. 099127595 with English Translation.

* cited by examiner

HIGH CONCENTRATION WATER PULSES FOR ATOMIC LAYER DEPOSITION

BACKGROUND OF THE INVENTION

1. Field of the Invention

The application relates generally to methods for forming thin films comprising oxygen by atomic layer deposition using water as a reactant. Such thin films may find use, for example, in integrated circuits.

2. Description of the Related Art

Atomic layer deposition (ALD) is a self-limiting process, whereby alternated pulses of reactants saturate a substrate surface and leave no more than one monolayer of material per cycle. The deposition conditions and reactants are selected to ensure self-saturating reactions, such that an adsorbed layer in one pulse leaves a surface termination that is non-reactive with the gas phase reactants of the same pulse. A subsequent pulse of a different reactant reacts with the previous termination to enable continued deposition. Thus, each cycle of alternated pulses leaves typically less or no more than about one molecular layer of the desired material. The principles of ALD type processes have been presented, for example, by T. Suntola, e.g. in the Handbook of Crystal Growth 3, Thin Films and Epitaxy, Part B: Growth Mechanisms and Dynamics, Chapter 14, Atomic Layer Epitaxy, pp. 601-663, Elsevier Science B.V. 1994, the disclosure of which is incorporated herein by reference. Variations of ALD have been proposed that allow for modulation of the growth rate. However, to provide for high conformality and thickness uniformity, these reactions are still more or less self-saturating.

SUMMARY OF THE INVENTION

In accordance with some embodiments, methods for forming thin films comprising oxygen on a substrate in a reaction space by atomic layer deposition are provided. The methods include a deposition cycle comprising: providing a vapor phase reactant pulse of a first reactant to the reaction space such that it forms no more than a monolayer of first reactant on the substrate surface; removing excess first reactant from the reaction space; providing a vapor phase reactant pulse of a second reactant comprising water to the reaction space, such that the partial pressure of water in the reaction space is greater than about 100 mTorr; and removing excess second reactant and any reaction byproducts from the reaction space In accordance with some embodiments, methods for forming thin films comprising oxygen by atomic layer deposition on a substrate in a reaction space are provided. The methods comprise: alternately and sequentially providing a vapor phase reactant pulse comprising a precursor comprising chlorine and a vapor phase reactant pulse comprising water to the reaction space; wherein the vapor phase reactant pulses are repeated until a thin film of a desired thickness is obtained, wherein the vapor phase reactant pulse comprising water is provided such that the partial pressure of water in the reaction space is greater than about 200 mTorr.

In accordance with some embodiments, processes for forming thin films by atomic layer deposition on a substrate in a reaction space are provided. The processes comprise alternately and sequentially contacting a substrate with a vapor phase reactant pulse comprising a first precursor and a vapor phase reactant pulse comprising water, wherein the water is provided such that the partial pressure of water in the reaction space is greater than about 250 mTorr; and repeating the alternate and sequential pulses until a thin film of a desired thickness is obtained.

For purposes of summarizing the invention and some of the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiments disclosed.

DETAILED DESCRIPTION OF THE PREFERRED EMBODIMENT

Figure 1:
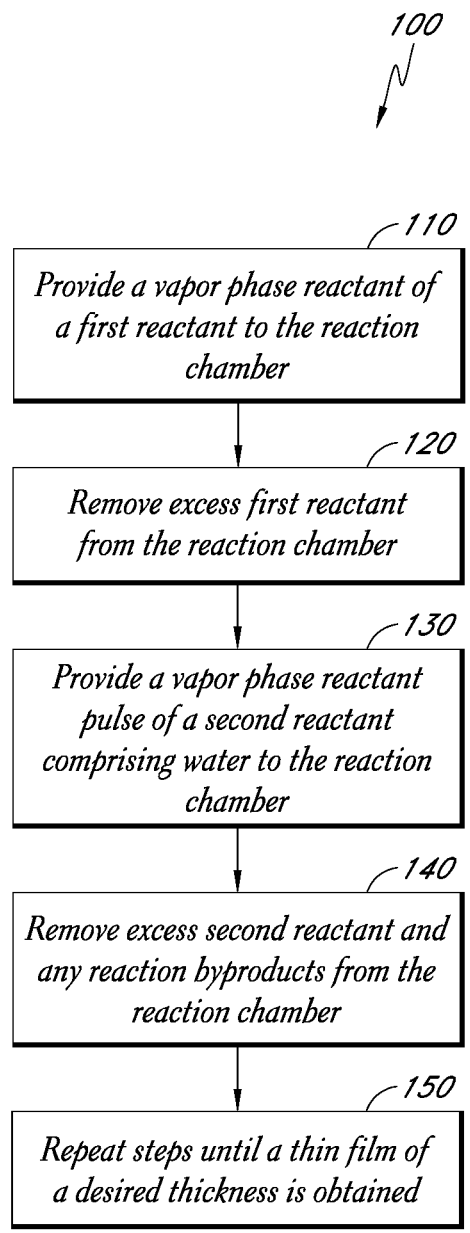
FIG. 1 is a flow chart generally illustrating a method for forming a thin film comprising oxygen in accordance with some embodiments.

Thin films comprising oxygen can be deposited on a substrate by atomic layer deposition (ALD) type processes using the methods and apparatuses described herein. While illustrated in the context of forming a thin film comprising oxygen in part of an integrated circuit, dielectric oxide, capacitor, transistor, or other semiconductor device, the skilled artisan will readily appreciate the application of the principles and advantages disclosed herein to various other contexts in which thin films comprising oxygen are useful.

Atomic Layer Deposition (ALD)

ALD type processes are based on controlled, self-limiting surface reactions. Gas phase reactions are avoided by feeding the precursors alternately and sequentially into the reaction space. Vapor phase reactants are separated from each other in the reaction space, for example, by removing excess reactants and/or reactant byproducts from the reaction space between reactant pulses.

ALD processes are preferred to chemical vapor deposition processes (CVD) in some applications because the self limiting nature of ALD processes allows greater control of film growth. ALD processes can also produce thin films with greater uniformity than some CVD processes.

Briefly, in ALD processes a substrate is loaded into a reaction space and is heated to a suitable deposition temperature, generally at lowered pressure. Deposition temperatures are typically maintained below the thermal decomposition temperature of the reactants but at a high enough level to avoid condensation of reactants and to provide the activation energy for the desired surface reactions. Of course, the appropriate temperature window for any given ALD reaction will depend upon the surface termination and reactant species involved. Here, the temperature is preferably below about 600° C., more preferably below about 500° C., even more preferably below 400° C., and most preferably below about 300° C. Particular deposition temperatures for some specific embodiments are provided below.

A first reactant is conducted or pulsed into the reaction space in the form of a vapor phase pulse and contacted with the surface of the substrate. Conditions are preferably selected such that no more than about one monolayer of the first reactant is adsorbed on the substrate surface in a self-limiting manner. Excess first reactant and reaction byproducts, if any, are removed from the reaction space, such as by purging with an inert gas. The appropriate pulsing time can be readily determined by the skilled artisan based on the particular circumstances.

Purging the reaction space means that vapor phase precursors and/or vapor phase byproducts are removed from the reaction space, such as by evacuating the reaction space with a vacuum pump and/or by replacing the gas inside the reactor with an inert gas such as argon or nitrogen. Typical purging times are from about 0.05 to 20 seconds, more preferably between about 0.25 and 10, and still more preferably between about 0.5 and 2 seconds. However, other purge times can be utilized if necessary, such as where highly conformal step coverage over extremely high aspect ratio structures or other structures with complex surface morphology is needed. Also, batch ALD reactors can utilize longer purging times because of increased volume and surface area. The purge time can be determined by the skilled artisan based on the particular circumstances.

A second gaseous reactant is pulsed into the reaction space where it reacts with the first reactant bound to the surface. Excess second reactant and gaseous byproducts of the surface reaction are removed from the reaction space, preferably by purging with the aid of an inert gas and/or evacuation. The steps of pulsing and purging are repeated until a thin film of the desired thickness has been formed on the substrate, with each cycle leaving typically less than or no more than a molecular monolayer.

As mentioned above, each pulse or phase of each cycle is preferably self-limiting. An excess of reactants is supplied in each phase to ideally saturate the susceptible structure surfaces. Surface saturation ensures reactant occupation of all available reactive sites (subject, for example, to physical size or "steric hindrance" restraints) and thus ensures excellent step coverage. In practice, complete surface saturation can be difficult to achieve.

It is desirable to form a continuous film with a reduced number of cycles and shorter cycle time. Longer pulses of reactants can improve step coverage for each cycle and produce a higher growth rate per cycle. However, longer pulse times can increase the cycle time and overall wafer processing time by an amount greater than the gain in film thickness growth per cycle produced by the longer pulse times. Therefore, it is desirable to optimize the pulse time and reaction conditions such that a high quality continuous film is achieved after a low number of cycles, with each cycle optimized to a relatively short duration. Consequently, small gains in the growth per cycle and quality of the deposited film without requiring longer pulse lengths can significantly decrease wafer processing times and costs.

In some embodiments described herein, methods are described that increase the water concentration of water in the reactor resulting in improved surface saturation of the water molecules and increased film growth without using longer water pulse lengths while still exhibiting the self limiting nature typical of ALD processes. High concentrations of water in the reactor were previously thought to be difficult and almost impossible to purge out efficiently and residual water left in the reactor from the previous pulse could disrupt the self limiting nature of an ALD process. In the present processes, the resulting electrical properties of the metal oxide film are far superior to low dose water pulses, including less leakage current for the same EOT (equivalent oxide thickness). These improved results can also be achieved with shorter reactant pulses.

FIG. 1 is a flow chart generally illustrating a method for forming a thin film comprising oxygen in accordance with one embodiment. According to a preferred embodiment, a thin film comprising oxygen is formed on a substrate in a reaction space by an ALD type process 100 comprising multiple deposition cycles, each deposition cycle comprising:

providing a vapor phase reactant pulse of a first reactant to the reaction space such that it forms no more than a monolayer of first reactant on the substrate surface;

removing excess first reactant from the reaction space;

providing a vapor phase reactant pulse of a second reactant comprising water to the reaction space; and removing excess second reactant and any reaction byproducts from the reaction space;

This can be referred to as the oxide deposition cycle. The cycle is repeated until a thin film of a desired thickness and composition is obtained.

First, a vapor phase reactant pulse comprising a first reactant is provided to the substrate and reaction space 110.

The first reactant may comprise, for example and without limitation, an element selected from the group consisting of: La, Ce, Pr, Nd, Pm, Sm, Er, Gd, Tb, Dy, Ho, Tm, Yb, Sc, Ti, V, Cr, Mn, Fe, Co, Ni, Cu, Zn, Y, Zr, Nb, Mo, Tc, Ru, Rh, Pd, Ag, Cd, Lu, Hf, Ta, W, Re, Os, Ir, Pt, Au, Hg, Sb, Te, Be, Bi, B, C, Al, Si, P, In, Ga, Ge, and Sn. Preferably the first reactant comprises one or more of Ti, Al, Hf, Si, and Zr. In some embodiments, the first reactant comprises Hf and an $HfO_2$ thin film is deposited.

In some embodiments, a film comprising $HfO_2$ or $ZrO_2$ can be deposited. In some embodiments the $HfO_2$ or $ZrO_2$ film can be doped with a rare earth element, for example La, Ce, Pr, Nd, Pm, Sm, Er, Gd, Tb, Dy, Ho, Tm, Yb, Lu. In some embodiments, the deposited film comprises $HfTiO_2$, $ErHfO_2$, LaZrO, $SrBaTiO_3$, and $SrTiO_3$.

In some embodiments, the deposition process can begin and end with a pulse of water. For example, after the initial water pulse multiple deposition cycles comprising a first reactant pulse and a water pulse can be performed to deposit a film having a desired thickness.

In some embodiments the first reactant is preferably a halide. In some embodiments the halide is a chlorine compound and comprises at least one chlorine atom. In some embodiments metal halides are used, for example compounds having the formula $MX_n$, where M is a metal, X is a halogen and n is equal to the valence of M, for example $TiCl_4$, $TiBr_4$, and $TiI_4$ when M is Ti. In some preferred embodiments a metal halide precursor is selected from $AlCl_3$, $HfCl_4$, $SiCl_4$, and $ZrCl_4$.

In some embodiments the first reactant comprises one or more ligands selected from the group consisting of substituted or non-substituted alkyl-, alkylamide-, alkoxide-, amidinate-, aryl-, betadiketonate-, imido-amido- and cyclopentadienyl-compounds. In some embodiments, the metalorganic compounds are selected from the group consisting of trimethylaluminum, tetrakis(ethylmethyl)aminohafnium, tetrakis(dimethyl)aminohafnium, tetrakis(diethyl)aminohafnium, tetrakis(ethylmethyl)aminozirconium, tetrakis(dimethyl)aminozirconium and tetrakis(diethyl)aminozirconium.

Preferably, the first reactant forms no more than about a single molecular layer on the substrate. If necessary, any excess reactant can be purged or removed 120 from the reaction space. In some embodiments, the purge step can comprise stopping the flow of first reactant while still continuing the flow of an inert carrier gas such as nitrogen or argon.

Next, a vapor phase reactant pulse of a second reactant comprising water ($H_2O$) is provided 130 to the substrate and reaction space. In some embodiments, water may be provided as a mixture of water and inactive gas, such as nitrogen or argon.

Water is a polar molecule that typically exhibits strong hydrogen bonding forces. These physical properties result in concerns over slow outgassing of water from the reaction space after the water pulse. ALD processes are designed to avoid or minimize CVD type gas phase reactions. Residual water that is not adsorbed on the substrate surface that remains in the reaction space during the pulse of the first reactant can result in gas phase or CVD type reactions that can disrupt the self limiting nature of the ALD process. These reactions are also undesirable because they can cause uneven growth on the substrate surface.

Unexpectedly, increasing the partial pressure of water in the reaction space, increasing the flow rate of water to the reaction space, or increasing the vapor pressure in the water vessel did not cause problems with the quality of the deposited thin films. Surprisingly, the deposited thin films exhibited lower impurity content, improved electrical properties, higher growth rates, and/or better nucleation.

In some embodiments, water is provided to the reaction space such that the partial pressure of water in the reaction space is greater than about 10 mTorr, the typical partial pressure of water in the reaction space. Even more preferably, the water concentration or partial pressure is an order of magnitude greater than typical water concentration or partial pressure in the reaction space during processing.

The partial pressure of water in the reaction space can be adjusted in some embodiments by controlling the water source temperature, carrier gas flow rate, water flow rate, water source pressure, etc.

In some embodiments, water is provided to the reaction space such that the partial pressure of water in the reaction space is greater than about 100 mTorr. In some embodiments, water is provided to the reaction space such that the partial pressure of water in the reaction space is greater than about 200 mTorr or about 250 mTorr. In some embodiments, water is provided to the reaction space at even higher partial pressures, for example at partial pressures greater than 500 mTorr. In some embodiments, the partial pressure of water in the reaction space is greater than about 1000 mTorr, and in some cases above about 1500 mTorr. In some embodiments, the partial pressure of water in the reaction space is greater than about 2000 mTorr, and in some embodiments greater than about 2500 mTorr.

In some embodiments the water is supplied from a water source vessel that is maintained at a temperature above room temperature. Preferably the temperature of the water in the water source vessel is above about 37° C., more preferably above about 50° C., and most preferably above about 75° C. Maintaining the water source vessel at a temperature above room temperature can generate a higher water vapor pressure. For example, the vapor pressure of water at about 50° C. is about 92 Torr. In some embodiments, the water source vessel conditions are controlled such that a flow rate of water of above about 500 sccm is supplied to the reaction space.

Each oxide deposition cycle typically forms no more than about one molecular layer of oxide. If necessary, any excess reaction byproducts or water can be removed 140 from the reaction space. In some embodiments, the purge step can comprise stopping the flow of water while still continuing the flow of an inert carrier gas such as nitrogen or argon.

The oxide deposition cycle is typically repeated a predetermined number of times 150 to form an oxide of a desired thickness. In some embodiments, multiple molecular layers of oxide are formed by multiple deposition cycles. In other embodiments, a molecular layer or less of metal oxide is formed.

Removing excess reactants can include evacuating some of the contents of the reaction space or purging the reaction space with helium, nitrogen or any other inert gas. In some embodiments purging can comprise turning off the flow of the reactive gas while continuing to flow an inert carrier gas to the reaction space.

The precursors or reactants employed in the ALD type processes may be solid, liquid or gaseous material under standard conditions (room temperature and atmospheric pressure), provided that the precursors or reactants are in vapor phase before it is conducted into the reaction space and contacted with the substrate surface. "Pulsing" a vaporized precursor or reactant onto the substrate means that the precursor or reactant vapor is conducted into the reaction space for a limited period of time. Typically, the pulsing time is from about 0.05 to 10 seconds. However, depending on the substrate type and its surface area, the pulsing time may be even higher than 10 seconds.

Preferably, for a 300 mm wafer in a single wafer ALD reactor, a first reactant is pulsed for from 0.05 to 10 seconds, more preferably for from 0.1 to 5 seconds and most preferably for about 0.3 to 3.0 seconds. The second reactant comprising water is preferably pulsed for from about 0.05 to 10 seconds, more preferably for from 0.1 to 5 seconds, even more preferably for from about 0.2 to 3.0 seconds, and most preferably from about 0.1 to 0.5 seconds. However, pulsing times can be on the order of minutes in some cases. The optimum pulsing time can be readily determined by the skilled artisan based on the particular circumstances.

The mass flow rate of the reactants can also be determined by the skilled artisan. In one embodiment, for deposition on 300 mm wafers the flow rate of the first reactant is preferably between about 1 and 10,000 sccm without limitation, more preferably between about 100 and 500 sccm. The mass flow rate of the first reactant is usually lower than the mass flow rate of the second reactant comprising water, which is usually between about 10 and 10,000 sccm without limitation.

Typically, water flow rates to the reaction space are minimized to avoid outgassing of water during the next vapor phase reactant pulse, which can result in undesirable CVD reactions. For ALD methods known in the art the water flow rate to the reaction space is typically around 15 sccm or less. For most production tools the typical water flow rate is around 10-100 sccm.

In some embodiments, the flow rate of water to the reaction space is significantly greater than methods known in the art. Preferably, the flow rate of water to the reaction space is above about 100 sccm. More preferably, the flow rate of the water to the reaction space is above about 500 sccm. Even more preferably, the flow rate of water is above about 750 sccm. Most preferably the water flow rate is above about 1000 sccm. In some embodiments, the water flow rate is above 2000 sccm or even above 2500 sccm. The water flow rates correspond to the mass flow of water and exclude any carrier gas flow.

The pressure in the reaction space is typically from about 0.01 (0.0075 Torr) to about 20 mbar (15 Torr), more preferably from about 0.5 Torr to about 5 Torr. However, in some cases the pressure will be higher or lower than this range, as can be readily determined by the skilled artisan.

Before starting the deposition of the film, the substrate is typically heated to a suitable growth temperature. Preferably, the growth temperature of the thin film comprising oxygen is below about 600° C., more preferably below about 500° C., even more preferably below about 400° C., and most preferably below about 300° C. In some embodiments, the substrate growth temperature is preferably 250° C. to 300° C. In some embodiments the substrate temperature is preferably below about 250° C. and more preferably below about 200° C. In some embodiments, the substrate temperature during the providing and removing steps can be below 100° C. and as low as room temperature or about 15° C. to 25° C.

The deposition cycles can be repeated a predetermined number of times or until a desired thickness is reached. Preferably, the thin films are as thin as several Å and more preferably between about 3 Å and 200 nm thick In some embodiments the thin film is crystalline as deposited. In some embodiments the thin film is amorphous as deposited. In some embodiments, the substrate can be annealed to increase the crystallinity of the thin film.

In some embodiments the monolayer coverage per pulse of first reactant is greater than about 20%. Rutherford Backscattering Spectroscopy (RBS) can be used to first determine the surface coverage per cycle. The monolayer coverage can then be calculated by dividing the RBS surface coverage per cycle by the bulk amorphous density of the oxide comprising the first reactant. Preferably, the monolayer coverage per pulse of first reactant is greater than about 21% and even more preferably is greater than 22%.

The methods described herein can provide many advantages over methods known in the art. The methods described herein can improve film nucleation. Improved film nucleation can increase monolayer coverage per cycle. Improved film nucleation and increased monolayer coverage per cycle can result in a higher growth rate per cycle. For example, increased monolayer coverage per cycle results in an ALD film that "closes" (covers the underlying material completely in a continuous ALD film of targeted type) in fewer cycles. The improved film closure can result in improved EOT scaling, for example leakage versus EOT line is maintained as the EOT decreases because a continuous ALD film is formed in fewer cycles.

The methods described herein can produce higher quality thin films that can exhibit improved physical scaling, improved leakage performance, and lower EOT for a given thickness of the deposited thin film. Further, no adverse particle impact was observed for the temperatures used in the examples.

The methods described herein can also produce a thin film with lower impurities, particularly lower chlorine impurities when a precursor comprising a chloride is used.

The methods described herein can also produce improved reactant saturation per pulse without requiring longer pulse times. The processing time and cost per wafer are decreased by the increased growth rate per cycle without being coupled with an increase in the length of each cycle.

Water Delivery

Water can be provided to the reaction space by a variety of methods. Typically, water is supplied to the reaction space at room temperature and at a low partial pressure along with a carrier gas. In accordance with the methods described herein, water can be provided to the reaction space at a higher partial pressure in the reactor and/or at a larger flow rate by various modifications.

In some embodiments, water can be heated in a solid source oven and provided to the reaction space. For example, U.S. Pat. No. 7,122,085 to Shero et al. discloses configurations of solid source ovens that can be used in the present methods. The disclosure of the configurations of solid source ovens in U.S. Pat. No. 7,122,085 is incorporated by reference herein.

In some embodiments water can be supplied to the reaction space by a steam generator or direct liquid injector (DLI) system. Commercial examples of high purity steam generators and direct liquid injector systems include those manufactured by RASIRC™. For example, the high purity steam generation systems manufactured by RASIRC™. In some embodiments, the steam generator, DLI system, or other RASIRC™ systems may be modified to produce the desired water flow rate conditions.

Water Source Vessel

U.S. Patent Publication No. 2005/0000428 to Shero et al. discloses various reactant source vessels. The disclosure of the reactant source vessels in U.S. Patent Publication No. 2005/0000428 is incorporated by reference herein. In some embodiments, the water source vessel can comprise any of the reactant vessels disclosed in U.S. Patent Publication No. 2005/0000428.

In some embodiments, the water source vessel is heated to a temperature above about 37° C. In some embodiments, the increased vapor pressure of the water can be used to supply water at the desired flow rate and/or to achieve the desired partial pressure of water in the reactor. In some embodiments, water can be supplied to the reactor without the aid of a carrier gas.

In one embodiment, the operation of a Peltier device or thermoelectric cooler can be reversed such that it can be used to heat the water source vessel.

In some embodiments, the water pulse can be accompanied by a carrier gas, such as nitrogen. In some embodiments, the flow rate of the carrier gas can be adjusted to achieve a desired partial pressure of water in the reactor.

In some embodiments, a carrier gas can flow or bubble through a water source vessel and its contents. Flowing the carrier gas through the water can entrain water and water vapor in the carrier gas stream. The carrier gas and water can then flow to the reaction space. In some embodiments water can be provided to the reaction space by flowing a carrier gas through the contents of the water source vessel.

In other embodiments, a carrier gas can flow across an outlet of a water source vessel. The flow of the carrier gas across the outlet of the water source vessel can cause water and water vapor to flow from the water source vessel and mix with the carrier gas. The carrier gas and water can then be provided to the reaction space. In some embodiments, the water can be provided to the reaction space by flowing a carrier gas across the outlet of the water source vessel.

In some embodiments, the water source vessel can be heated to higher temperatures, for example, temperatures above about 55° C. In some embodiments, the water source vessel is heated to above about 65° C. In other embodiments, the water source vessel is heated to above about 75° C. Higher temperatures increase the vapor pressure of the water in the water source vessel. The higher water pressure can result in higher water flow rates and/or higher water partial pressures in the reaction space. The water flow rate can be controlled by throttling a flow control valve, using a restrictive orifice in the water supply line, using another type of flow control valve, or by any other method known in the art to control vapor flow rates.

In some embodiments, the water flow rate to the reaction space is controlled such that the partial pressure in the reaction space is greater than about 200 mTorr or about 250 mTorr. In some embodiments, water is provided to the reaction space at even higher partial pressures, for example at partial pressures greater than 500 mTorr. In some embodiments, the partial pressure of water in the reaction space is greater than about 1000 mTorr, and in some cases above about 1500 mTorr. In some embodiments, the partial pressure of water in the reaction space is greater than about 2000 mTorr, and in some embodiments greater than about 2500 mTorr.

In some embodiments, the water in the water source vessel has a vapor pressure of about 92 Torr or greater. In some embodiments, the water source vessel conditions are controlled such that a flow rate of water of above about 500 sccm is supplied to the reaction space.

Measuring the Water Flow to the Reaction Space

The water flow rate can be quantified by several different ways, including but not limited to measuring the water vapor pressure in the water source vessel, the water flowrate delivered to the reactor, and the partial pressure in the reaction chamber.

In some embodiments the water flow rate is measured by the vapor pressure of water in the water source vessel. The pressure can be readily determined based on the temperature of the water in the water source vessel. The resulting flow rate of the water to the reaction space can be calibrated based on the particular features of the reaction system, for example the carrier gas flow, reaction space pressure, any flow or pressure control devices on the water supply line, etc.

In some embodiments, the water flow rate is quantified by measuring the flow rate of water delivered to the reactor. For example, a flow meter can be used to measure the flow of water vapor to the reactor.

In some embodiments, the water flow can be quantified by the partial pressure or concentration of water in the reaction chamber.

The following Examples were performed in a Pulsar® P3000 Reactor, previously commercially available from ASM America, Inc. of Phoenix, Ariz. and ASM Europe B.V., Almere, Netherlands.

Example 1

A growth rate of 0.50 Å/cycle for $HfO_2$ was achieved by ALD using alternate and sequential pulses of $HfCl_4$ and water, with water pulse length under 500 ms in duration and the water source slightly below room temperature (15° C.). These process conditions typically result in about 15% monolayer coverage per cycle and low hydroxyl group (—OH) surface coverage.

Example 2

Figure 2:
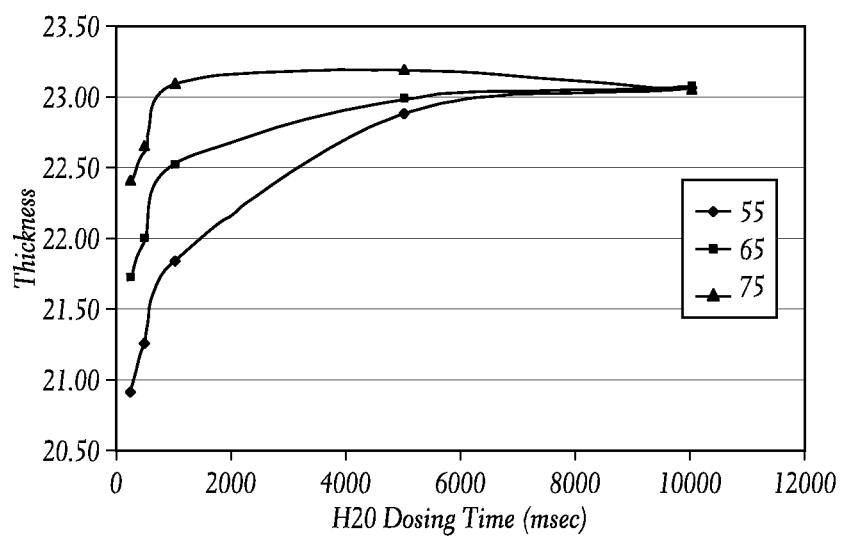
FIG. 2 is a graph illustrating film thickness for $HfO_2$ films deposited by ALD using $HfCl_4$ and water heated to different temperatures.

Thin films of $HfO_2$ were deposited on a substrate by alternately and sequentially providing $HfCl_4$ and water to a reaction space under various reactor and reactant process conditions. The substrate temperature was 300° C. FIG. 2 illustrates the effect of the water pulse time and water source temperature on the thickness of the deposited $HfO_2$ thin film. Increasing the water pulse time from 250 ms to 5 seconds resulted in an increased film growth rate for all temperatures. Increasing the water source temperature from 55° C. to 75° C. increased the thin film growth rate. For a given pulse time, increasing the temperature of the water source vessel resulted in an increased growth rate of the $HfO_2$ thin film. Nitrogen was used as a carrier gas.

Example 3

The thin film growth rate per cycle for $HfO_2$ films was also studied at water source vessel temperatures of 15° C., 37° C., 55° C., 65° C., and 75° C. Water and $HfCl_4$ were used to deposit $HfO_2$. The water pulse times were less than 1 second. The thickness of the $HfO_2$ films was measured at various deposition cycle intervals.

The average growth rate per cycle when the water source vessel source temperature was 15° C. was 0.50 Å/cycle. The average growth rate per cycle when the water source vessel source temperature was 37° C. was also ~0.50 Å/cycle. Thus, the growth rate was approximately the same for water source vessel source temperatures of 15° C. and 37° C.

Higher growth rates were observed at water source vessel temperatures around 55° C. and above. The average growth rate per cycle when the water source vessel source temperature was 55° C. was 0.54 Å/cycle. The average growth rate per cycle when the water source vessel source temperature was 75° C. was 0.55 Å/cycle. The average growth rate per cycle when the water source vessel source temperature was 65° C. was also 0.55 Å/cycle.

The reactor pressure was held constant at about 4 Torr by adjusting the throttle valve position on the water source reactor inlet. The water flow rate was then calculated based on the throttle valve position. An orifice, needle valve or some other controlling restriction can also be used. The flow rate was correlated to the % open of the throttle valve. The throttle valve response was then analyzed during water pulses. The water flow rate was then calculated using the correlation. The partial pressure of water in the reactor was then calculated based on the reactor pressure, flow rate of the carrier gas, and water flow rate.

The partial pressure of water in the reactor with a water source vessel temperature of 15° C. was calculated as 45 mTorr. The partial pressure of water in the reactor with a water source vessel temperature of 55° C. was calculated to be about 1500 mTorr. The partial pressure of water in the reactor with a water source vessel temperature of 65° C. was calculated to be about 1800 mTorr to about 2000 mTorr. The partial pressure of water in the reactor with a water source vessel temperature of about 75° C. was calculated to be about 2000 mTorr to about 2500 mTorr. The substrate temperature was held at about 300° C.

The highest average growth rate achieved was 0.58 Å/cycle with a water source vessel temperature of 75° C.

Example 4

Figure 3:
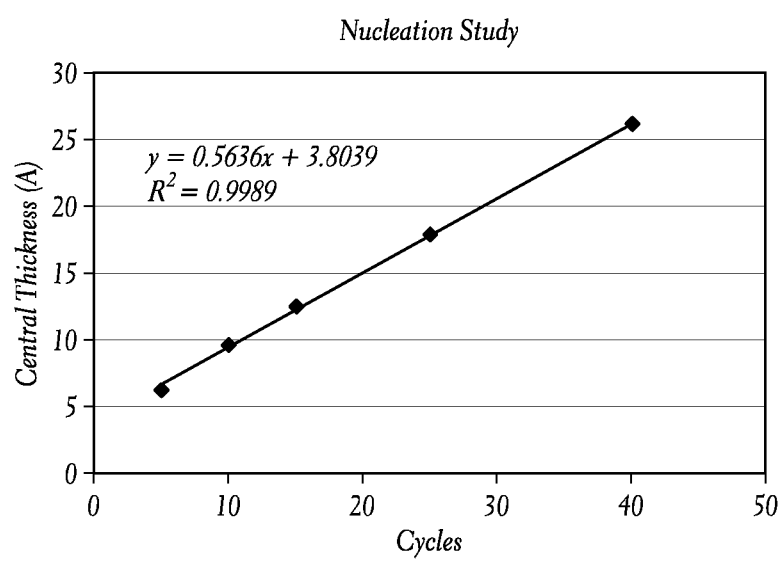
FIG. 3 is a graph illustrating center film thickness versus number of deposition cycles for $HfO_2$ films deposited by ALD using $HfCl_4$ and water at a vessel temperature of 75° C.

FIG. 3 illustrates the $HfO_2$ film thickness versus the number of deposition cycles. $HfO_2$ was deposited using $HfCl_4$ and water. The water source vessel temperature was about 75° C. The average growth rate per cycle was about 0.56 Å per cycle. The linear relationship indicates consistent nucleation and film growth between 5 and 40 cycles. No diminished or inhibited growth was observed for subsequent deposition cycles.

Figure 4:
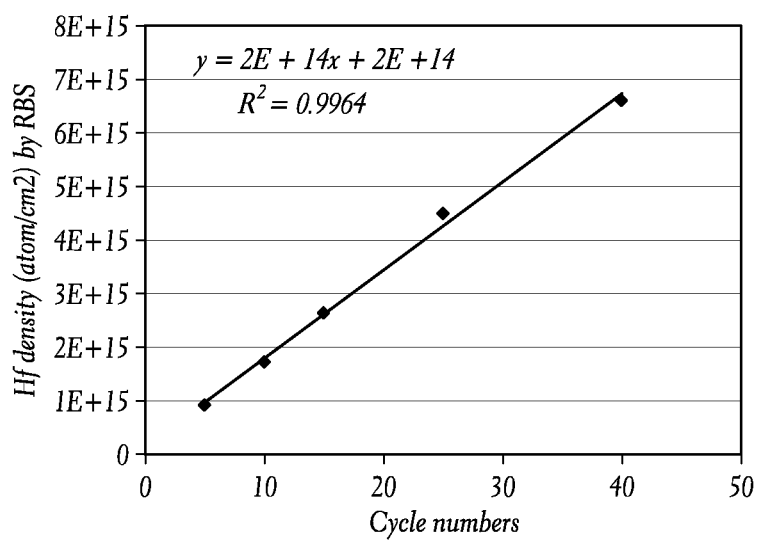
FIG. 4 is a graph illustrating Hf atom surface density versus number of deposition cycles for $HfO_2$ films deposited by ALD with water at a vessel temperature of 75° C.

Rutherford Backscattering Spectroscopy (RBS) was also used to study the deposited $HfO_2$ thin films. FIG. 4 illustrates the Hf atom density on the surface of the substrate versus deposition cycle number.

The RBS data indicates that about $2 \times 10^{14}$ Hf atoms/cm² are deposited per cycle resulting in a monolayer coverage of about approximately 21.8% per deposition cycle. The monolayer coverage per cycle of 21.8% was calculated by dividing the RBS surface coverage per cycle ($2 \times 10^{14}$ Hf atoms/cm²) by the bulk amorphous density of $HfO_2$ of about $9.15 \times 10^{14}$ Hf atoms/cm². In comparison, the typical monolayer coverage for this process with a regular water concentration pulse is about 15%. Therefore, the increased partial pressure of water and increased water concentration in the reaction space significantly improves the monolayer coverage with each cycle, thereby forming continuous films with a lower number of deposition cycles.

RBS was also used to measure the amount of chlorine present in the deposited $HfO_2$ thin films. Use of precursors comprising chlorine can cause impurities in the deposited thin films, for example, residual chlorine can be incorporated into the thin films. Unexpectedly, chlorine present in the deposited $HfO_2$ thin films was below the RBS lower detectable limit of 0.5%. The $HfO_2$ thin films produced by the methods described herein produced films with lower chlorine impurities than other methods known in the art.

Figure 6:
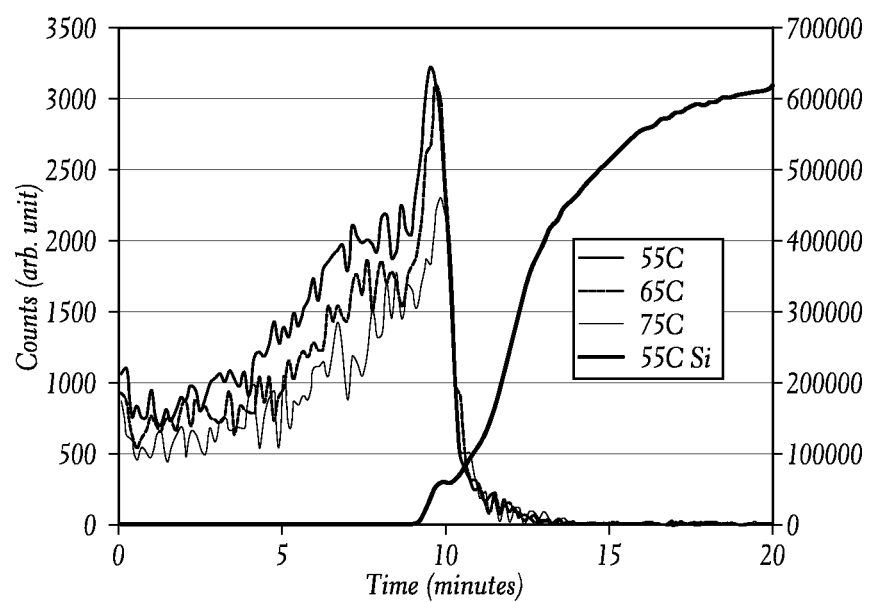
FIG. 6 is a secondary ion mass spectrometer (SIMS) image of the chlorine and silicon content of $HfO_2$ films deposited by ALD using $HfCl_4$ and water at various source temperatures.

FIG. 6 is a secondary ion mass spectrometer (SIMS) image of the chlorine content of the deposited $HfO_2$ thin films. The SIMS spectra displays the sputtering time (depth into sample) versus the intensity of the species in arbitrary units. The chlorine content was measured for the $HfO_2$ films deposited using water at a source temperature of 55° C., 65° C., and 75° C., respectively. The curves show that the chlorine content in the deposited $HfO_2$ film decreased as the water source temperature was increased. Similar data exist for hydrogen impurity (not shown) reduction with increasing water source temperature. The data suggests that high concentration water pulses improve film purity. FIG. 6 also shows where the HfO2 film stops and the silicon substrate starts via the up-turn in Si counts.

Example 5

Figure 5:
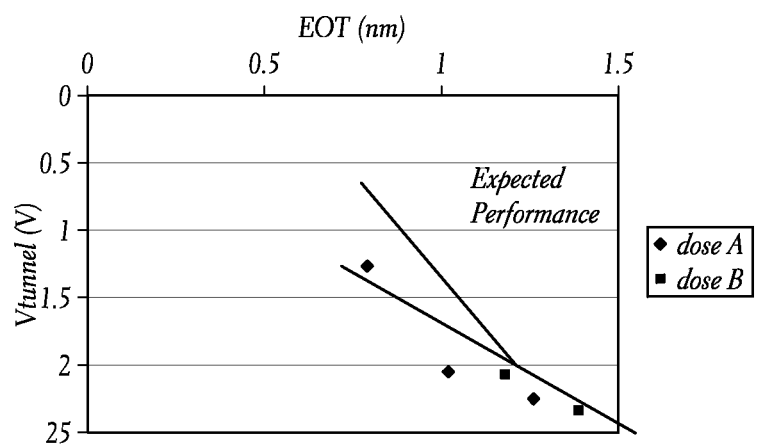
FIG. 5 is a graph illustrating tunnel voltage versus Equivalent Oxide Thickness (EOT) for $HfO_2$ films deposited by ALD with water at a vessel temperature of 75° C.

The electrical performance of the deposited $HfO_2$ thin films was also studied. FIG. 5 illustrates the tunnel voltage versus Equivalent Oxide Thickness (EOT) for deposited $HfO_2$ thin films. The thin $HfO_2$ films were deposited using $HfCl_4$ and water. The water source vessel source temperature was 75° C. The water pulses had a duration of 250 ms for the dose A group and 1000 ms for the dose B group.

The tunnel voltage and leakage current are inversely related. A higher tunnel voltage implies a lower leakage current. As illustrated in FIG. 5, the $HfO_2$ thin film deposited at a higher water partial pressure in the reactor exhibited improved leakage (higher tunnel voltage) at thinner EOT values compared to the expected performance based on $HfO_2$ films deposited by ALD methods known in the art. The improved leakage performance could be the result of improved stoichiometry in the deposited thin film, faster film closure resulting from increased monolayer coverage per cycle, higher film density, and lowered impurities in the deposited thin film.

It will be appreciated by those skilled in the art that various modifications and changes can be made without departing from the scope of the invention. Similar other modifications and changes are intended to fall within the scope of the invention, as defined by the appended claims.

We claim:

1. A method for forming a thin film comprising oxygen on a substrate in a reaction space by atomic layer deposition, the method comprising a deposition cycle comprising:

providing a vapor phase reactant pulse of a first reactant comprising hafnium and/or zirconium to the reaction space such that it forms no more than a monolayer of first reactant on the substrate surface;

removing excess first reactant from the reaction space;

providing a vapor phase reactant pulse of a second reactant comprising water to the reaction space, such that the partial pressure of water in the reaction space is greater than about 1000 mTorr, wherein the vapor phase reactant pulse of the second reactant comprises an amount of water at least an order of magnitude greater than that required to saturate the substrate surface; and removing excess second reactant and any reaction byproducts from the reaction space, thereby forming a deposited thin film comprising hafnium and/or zirconium and oxygen, and comprising less than 0.5 atomic percent chlorine as deposited.

2. The method of claim 1, wherein the deposition cycle is repeated until a thin film of a desired thickness is obtained.

3. The method of claim 1, wherein the first reactant further comprises an element from the group consisting of: Ti, Al, and Si.

4. The method of claim 3, wherein the first reactant comprises a chloride.

5. The method of claim 4, wherein the first reactant comprises $HfCl_4$ or $ZrCl_4$.

6. The method of claim 5, wherein the first reactant is $HfCl_4$ and $HfO_2$ is deposited.

7. The method of claim 1, wherein the partial pressure of water in the reaction space is greater than 1000 mTorr.

8. The method of claim 1, wherein the deposition cycle deposits greater than about 20% of a monolayer per cycle.

9. The method of claim 1, wherein the substrate temperature during the deposition cycle is above about 250° C.

10. The method of claim 1, wherein providing a vapor phase pulse of water comprises a pulse length of about 100 ms or higher.

11. A method for forming a thin film comprising oxygen by atomic layer deposition on a substrate, the method comprising:

alternately and sequentially contacting the substrate with:
a vapor phase reactant comprising a precursor comprising chlorine and hafnium; chlorine and zirconium; or chlorine and hafnium and zirconium; and
a vapor phase reactant comprising water, wherein the vapor phase reactants are alternately and repeatedly provided until a thin film of a desired thickness is obtained, the film comprising no more than 0.5 atomic % chlorine as-deposited, wherein the vapor phase reactant comprising water is provided such that the partial pressure of water in a reaction space is greater than about 1000 mTorr, and wherein contacting the substrate with the vapor phase reactant comprising water comprises contacting the substrate with an amount of water at least an order of magnitude greater than that required to saturate the substrate surface.

12. The method of claim 11, wherein the partial pressure of water in the reaction space is greater than about 1500 mTorr.

13. The method of claim 12, wherein the partial pressure of water in the reaction space is greater than about 2500 mTorr.

14. A process for forming a thin film by atomic layer deposition on a substrate in a reaction space, the method comprising:

alternately and sequentially contacting a substrate with a vapor phase reactant pulse comprising a first precursor comprising hafnium and/or zirconium and a vapor phase reactant pulse comprising water, wherein the water is provided such that the partial pressure of water in the reaction space is greater than about 1000 mTorr, and wherein the vapor phase reactant pulse comprising water comprises an amount of water at least an order of magnitude greater than that required to saturate the substrate surface; and repeating the alternate and sequential pulses until a thin film of a desired thickness is obtained, the film comprising no more than 0.5 atomic % chlorine as-deposited.

15. The method of claim 14, wherein the partial pressure of water in the reaction space is greater than about 2000 mTorr.

16. The method of claim 11, wherein the thin film comprising oxygen comprises $HfO_2$ or $ZrO_2$.

17. The method of claim 14, wherein the thin film comprising oxygen comprises $HfO_2$ or $ZrO_2$.

18. The method of claim 1, wherein the thin film comprising oxygen further comprises one or more elements from the group consisting of La, Ce, Pr, Nd, Pm, Sm, Er, Gd, Tb, Dy, Ho, Tm, Yb, Lu, Ba, and Sr.

19. The method of claim 11, wherein the thin film comprising oxygen further comprises one or more elements from the group consisting of La, Ce, Pr, Nd, Pm, Sm, Er, Gd, Tb, Dy, Ho, Tm, Yb, Lu, Ba, and Sr.

20. The method of claim 14, wherein the thin film comprising oxygen further comprises one or more elements from the group consisting of La, Ce, Pr, Nd, Pm, Sm, Er, Gd, Tb, Dy, Ho, Tm, Yb, Lu, Ba, and Sr.

\* \* \* \* \*